United States Patent [19]

Falkowski et al.

[11] Patent Number: 5,252,913

[45] Date of Patent: * Oct. 12, 1993

[54] LINE SENSOR WITH CORONA SHIELD

[75] Inventors: Paul P. Falkowski, Clearwater; Peter H. Forest, Oldsmar; Donald W. Selby, Niceville, all of Fla.

[73] Assignee: Square D Company, Palatine, Ill.

[*] Notice: The portion of the term of this patent subsequent to Oct. 12, 2009 has been disclaimed.

[21] Appl. No.: 345,071

[22] Filed: Apr. 28, 1989

Related U.S. Application Data

[63] Continuation-in-part of Ser. No. 108,389, Oct. 14, 1987.

[51] Int. Cl.$^5$ .............................................. G01R 1/22
[52] U.S. Cl. ............................. 324/127; 174/140 R; 324/117 R; 324/126
[58] Field of Search .................... 324/107, 117 R, 126, 324/127; 364/483; 174/140 R, 140 S

[56] References Cited

U.S. PATENT DOCUMENTS

| | | | |
|---|---|---|---|
| 2,475,230 | 7/1949 | Frey et al. | 174/169 X |
| 2,504,647 | 4/1950 | Camilli | 324/127 |
| 3,187,282 | 6/1965 | Pierce et al. | 324/126 |
| 3,251,014 | 5/1966 | Stein, Jr. | 324/127 |
| 3,363,174 | 1/1968 | Hudson et al. | 324/127 |
| 3,380,009 | 4/1968 | Miller | 336/84 C |
| 3,386,059 | 5/1968 | Stein, Jr. et al. | 324/127 |
| 3,418,575 | 12/1968 | Spindle | 336/84 C |
| 3,456,222 | 7/1969 | Berg | 336/84 C X |
| 3,483,314 | 12/1969 | Harmon | 174/168 X |
| 3,770,877 | 11/1973 | Mashikian et al. | 174/143 |
| 3,932,810 | 1/1976 | Kohler | 324/126 |
| 4,074,193 | 2/1978 | Kohler | 324/126 |
| 4,307,365 | 12/1981 | Martincic | 336/96 |
| 4,593,276 | 6/1986 | Aida et al. | 324/127 |
| 4,728,887 | 3/1988 | Davis | 324/127 |

FOREIGN PATENT DOCUMENTS

| | | | |
|---|---|---|---|
| 0606438 | 12/1934 | Fed. Rep. of Germany | 324/126 |
| 0153257 | 11/1981 | Japan | 324/126 |
| 842425 | 7/1958 | United Kingdom | 174/177 |

OTHER PUBLICATIONS

Anderson Electric Corporation Manufacturer's Catalog No. 57 (2nd Sec.) (Sec. B), pp. 33-B and 36-B, Oct. 1, 1957.

*Primary Examiner*—Reinhard J. Eisenzopf
*Assistant Examiner*—W. Burns
*Attorney, Agent, or Firm*—Larry I. Golden

[57] ABSTRACT

A combined current and voltage measuring sensor for measuring voltage and current on a primary conductor, the sensor including a cast resin body having therein a aluminum support, the support having an aluminum encasement mounted thereto. An air core coil is encapsulate with the encasement within the cast resin body adjacent a grooved portion in the cast resin body for maintaining the primary conductor in the top of the cast resin body. The groove and the aluminum encasement cooperate to precisely locate the primary conductor with respect to the air core coil. A keeper assembly mechanically maintains and locates the primary conductor in the groove and further provides an electrical connection from the primary conductor to the voltage measuring apparatus of the sensor. A corona shield encapsulated within the cast resin body is at the same potential as the conductor and is interposed between the air coil and the groove of the cast resin body.

17 Claims, 4 Drawing Sheets

LINE SENSOR WITH CORONA SHIELD

RELATED APPLICATION DATA

This continuation-in-part application has common elements of the specification and drawing with application Ser. No. 07/108,389 filed Oct. 14, 1987 and assigned to the assignee of the present application. A claim for priority for the common elements between the applications is made under the authority of 35 U. S. C. 120, and the specification and drawing of application Ser. No. 07/108,389 is incorporated by reference herein.

BACKGROUND OF THE INVENTION

This invention relates in general to a voltage and current sensing apparatus with a cast resin body which measures both voltage and current in a conductor at a potential greater than 15 Kilovolts. As the voltage of a conductor increases, corona effects or partial discharges in associated insulative media become more difficult to avoid. If they are not avoided, shortened equipment life, and audio and radio frequency noise pollution can result. It is also necessary to avoid galvanic corrosion among components of the line sensor and the conductor. In particular, the invention relates to a voltage and current sensor transducer support apparatus containing an interior coil having a non-magnetic core, a non-inductive resistance voltage divider, and a corona shield. In addition to sensing the power parameters of current and voltage in the conductor, the transducer support positions and holds up the conductor.

Current and voltage sensors are generally used by utility companies to electronically control capacitor banks, voltage regulators, reclosures, switches, electrical distribution, feeder optimization, and for conservation, load managing, and remote metering. Prior art devices, while accomplishing these feats, do not produce repeatable, consistent readings. This is primarily due to the fact that the prior art devices utilize an iron core transformer coil.

Present devices for indicating or sensing voltages or currents of conductors of power lines for purposes of metering or control are relatively complex, difficult to connect with the conductors of the power line and often cannot be connected with the power line conductors unless time consuming safety procedures and safety devices are employed. With most prior art voltage and sensing devices, the power line must be disconnected so as to stop the flow of electricity therethrough and, in many applications, the power line must be cut to allow the insertion of the current sensing apparatus. This requires down time and loss of revenue to the utility company.

It is generally known that coil output is affected by the outside diameter of the primary cable. Prior art sensing apparatus have used charts and graphs to approximate the voltage and current sensing information developed from the iron core transformer coil. This use of charts and graphs has been cumbersome and difficult to generate or even apply with varying cable sizes. This has produced non-repeatable results with respect to voltage and current sensors. In a utility application, approximately 200 different cable sizes could be used between 0.25 inch in cable diameter through 1.25 inches cable diameter. In view of these varying cable sizes, it is difficult to generate or even apply individual correction factors to each cable size. This is particularly true where an iron core coil has been used. As the voltage and current levels increase, the iron core saturates and will not produce consistent readings. Thus, companies, in the past, manufacturing voltage and current sensors have used a graph which does not progress in a linear fashion.

A combined current and voltage measuring apparatus is shown in U.S. Pat. No. 4,074,193 to Kohler, entitled COMBINED CURRENT AND VOLTAGE MEASURING APPARATUS. Another voltage or current sensing apparatus is shown in U.S. Pat. No. 3,251,014 to Stein, Jr., entitled ELECTRICAL COUPLING DEVICE. These patents are illustrative of the prior art with respect to voltage and current sensing apparatus used in high voltage applications. The patent to Kohler illustrates one version of a sensing apparatus that requires the power through the conductor be discontinued for installation of the sensor.

Generally, current and voltage sensing apparatus which do not require the disconnection of the primary conductor, such as the one shown in U.S. Pat. No. 3,251,014, to Stein, Jr., entitled ELECTRICAL COUPLING DEVICE, utilize an iron core coil. Use of the iron core coil will produce a non-linear and generally non-repeatable response with respect to voltage or current deviations or applications, and thus renders such devices relatively inaccurate for various applications. Further, the Stein, Jr. reference does not disclose any means for mechanically maintaining the conductor in the groove at the top of the casting. Thus, the Stein reference does not teach a means by which the conductor is positioned with respect to the groove. Positioning of the conductor in a voltage and current sensing apparatus is critical for obtaining precise and repeatable readings from the sensing apparatus.

Capacitively graded bushings to reduce voltage stresses are generally known. An patented example of such is provided by U.S. Pat. No. 3,770,877 issued to Mashikian et. al. on Nov. 6, 1973 describing a CAPACITIVELY GRADED ELECTRICAL INSULATING DEVICES. U.S. Pat. No. 3,418,575 issued to Spindle on Dec. 24, 1968 describing a HIGH VOLTAGE CURRENT MEASURING DEVICE EMPLOYING MEANS RESPONSIVE TO THE ELECTROMAGNETIC FIELD GENERATED BY THE CURRENT includes a plurality of capacitor plates, one of which is circular and caps the insulative reservoir. Shields are also shown in connection with current sensors such as U.S. Pat. No. 3,380,009 issued to Miller on Apr. 23, 1968 describing a HIGH VOLTAGE CURRENT TRANSFORMER, and U.S. Pat. No. 3,456,222 issued to Berg on Jul. 15, 1969 describing a HIGH VOLTAGE CURRENT TRANSFORMER.

It is, therefore, an object of the present invention to provide a voltage and sensing apparatus which allows installation without interference with the primary conductor and without disconnecting the power supply through the conductor. Further, it is an object of the invention to provide a voltage and sensing apparatus which securely maintains the primary conductor precisely adjacent a select portion of the sensing apparatus for purposes of producing an even and measured response with respect to the metering and measuring of current and voltage.

It is another object of the present invention to provide a voltage and current sensing apparatus which produces a linear and repeatable response in all applications with respect to varying currents, voltages and conductor diameters.

It is a further object of the present invention to provide a voltage and current sensor which may replace an existing insulator on a power line and thus provide the mechanical support to the conductor which was previously supplied by the insulator. It is another object of the present invention to provide a design that can replace existing monitoring type sensing devices with considerable reduction of costs. It is another object of the present invention to provide a sensing device that can be installed without disrupting service to a customer and without modifications to the utility pole structure. It is a further object of the present invention to provide a sensor which will provide a linear output proportional to the current and voltage on the line which can then be input into a transducer to allow communication with a utility company computer network. These goals must be attained without corona or partial discharges in or around the line sensor, or galvanic corrosion among components of the line sensor and the conductors.

SUMMARY OF THE INVENTION

The combined current and voltage sensing apparatus of the present invention realizes the above objects by including in an encapsulating cast body of cycloaliphatic epoxy an air core coil spaced a select distance from a conductor groove and connector, or keeper, assembly mounted at the top of the epoxy casting. An aluminum support and encasement surrounding the air core coil precisely locates the coil with respect to the conductor. The sensor is designed to be horizontally or vertically mounted directly to a wooden cross beam of a utility pole and to replace an existing insulator. The keeper or connector assembly is designed such that the primary conductor fits in the groove of the casting and then has secured thereover an aluminum keeper having a reversible groove design that allows the use of conductors ranging from 0.25 inch in diameter to 1.25 inches in diameter. The aluminum keeper is secured to brass nuts imbedded in the epoxy body by stainless steel bolts. A corona screen extends about the circumference of each brass nut adjacent a brass nut upper end and projects within the epoxy body towards the circumference of the epoxy body. The corona screen approximates an infinite plane and rod solution to the approximation of a rod presented by the aluminum support and encasement. The brass nuts are spaced outwardly of, and to either side of the conductor groove. The contiguous components exposed to ambient air are fabricated from materials having a low difference of galvanic potential. Where a large galvanic potential could possibly exist, the components are either separated or encapsulated within the epoxy body. By selectively spacing the encapsulated air core coil from the primary conductor and by controlling the windings around the air core coil, it is possible to maintain a high degree of accuracy, on a linear basis, with respect to current variations. The air core coil has extending therefrom current signal (black) and ground (white) leads. The voltage sensing portions of the line sensor includes a connection lead to the imbedded brass nuts which is in electrical contact with the conductor through the stainless steel bolts and the aluminum keeper assembly. The connection lead connects the brass nuts and a primary resistor. The end of the primary resistor opposite the connection lead is connected to a secondary resistor and a voltage signal (red) lead which conducts the signal proportional to conductor voltage outside the line sensor. By selectively spacing the air core coil with respect to the cable, the coil output will be linear for all primary cable sizes. Further, not only will the output be linear both with increasing and decreasing primary currents, but the linear output will be repeatable. This insures a high degree of accuracy in the sensing apparatus.

In the present design, the output is linear, the correction factor is represented by a straight line that goes through zero. In view of this, an equation has been developed employing constants that relate to the physical coil dimensions and total winding turns of the coil. This equation may be used to identify any cable diameter within a range for a given coil design. The equation contains correction factors based on coil design. These correction factors would change with respect to different coil dimensions and total winding turns. However, these factors are known at the time of manufacture of the sensing apparatus and thus may be programmed into a utility company's computer system to automatically account for varying cable diameters.

An aluminum coil support is provided within the epoxy casting of the insulator. The coil support is comprised of an aluminum circular support extending from the base of the sensor to a select distance from the top of the sensor apparatus. Mounted to the aluminum shaft is an aluminum rectangular encasement which is designed to encase the open air coil. The support is mounted directly to the wooden cross beam by means of a mounting bolt such that the epoxy insulator surrounding the shaft is free to "float" to a limited extent. This accounts for the differing coefficients of expansion between the aluminum material and the epoxy. By mounting and securing the aluminum support casting in this manner, a means for preventing cracking of the epoxy due to weather and thermal changes is provided.

In the present invention, all electrical sensing elements are sealed in a homogeneous casting of cycloaliphatic epoxy insulator configuration. The skirt portion provides increased creepage distance, as is common in high voltage insulators, and the general mechanical support structure of an insulator for which the current and voltage sensor is intended to replace. Due to the mounting of the coil support within the epoxy body, weather resistant life is provided in outdoor applications. In addition, no maintenance is required once the unit is installed. The keeper design comprises an aluminum keeper with stainless bolts securing the aluminum keeper to the embedded brass nuts. The voltage and current sensor is intended to be manufactured for use in standard 25 kilovolt, or 38 kilovolt sizes and will give a linear output voltage proportional to current flow in the source conductor.

In an alternative embodiment, if higher accuracy is desired, a variable output shaping resistor can be added between the black and white leads of the air core transformer. This will increase accuracy but may not be necessary depending on the accuracy of the windings of the air coil.

BRIEF DESCRIPTION OF THE DRAWING

The features of the present invention which are believed to be novel, useful, and nonobvious are set forth with particularity in the appended claims. The invention, together with further objects and advantages thereof, may best be understood by reference to the following description, taken in conjunction with the accompanying drawings in the several figures of which like reference numerals identify like elements, and in which:

DETAILED DESCRIPTION

Figure 1:
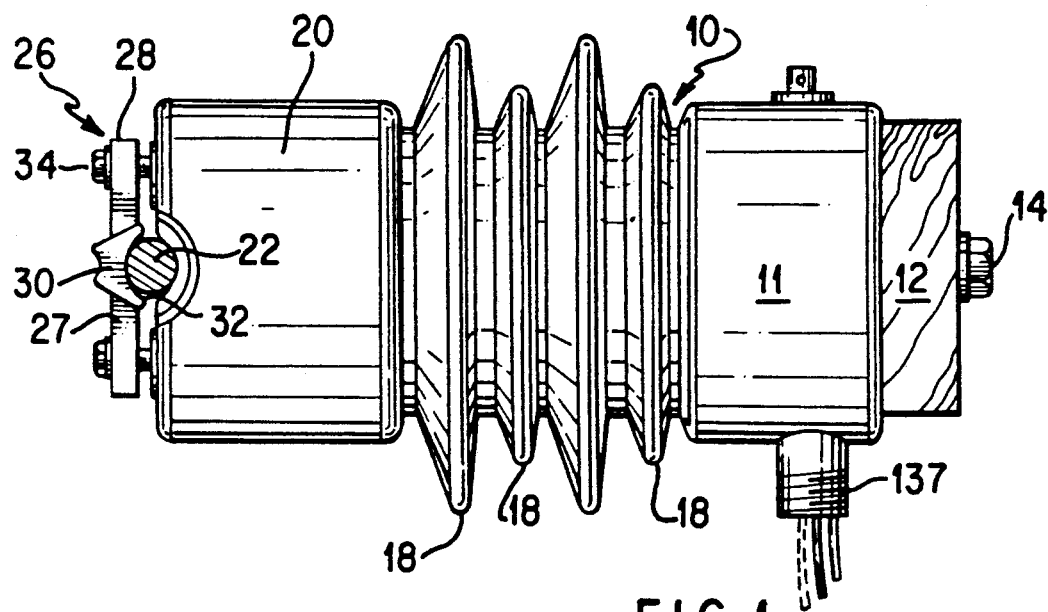
FIG. 1 is a side view of the voltage and current sensor shown, mounted to a wooden cross beam and having a primary conductor connected thereto.

This invention relates to an apparatus for current and voltage sensing in a primary conductor support principally for use in a utility environment. FIG. 1 of the drawings shows the voltage and current sensor 10 in side view attached to wooden cross beam 12. Wooden crossbeam 12 is intended to reflect the cross beam of a utility pole application for which voltage and current sensor 10 would serve to replace an existing insulator (not shown). The insulator is generally of a design similar to that of the voltage and current sensor 10 as far as the shape and configuration goes. Thus, mounting the voltage and current sensor 10 in place of the standard type insulator on wooden cross beam 12 would not pose any significant structural changes with respect to the utility pole and the primary conductor. Mounting bolt 14 serves to connect the voltage and current sensor 10 to the wooden cross beam 12 such that there is a mechanical and secure connection therewith.

Voltage and current sensor 10 includes epoxy body 11 having a base 16 out of which projects output conductors 36 at one end and, at a distal end, projects ground cap 38 and ground wire 40. Skirts 18 are formed in isulartive epoxy body 11 intermediate between base 16 and top portion 20 of epoxy body 11. Top portion 20 has conductor groove 24 therein which receives the primary conductor 22. Primary conductor 22 is secured in groove 24 by keeper assembly 26. Keeper assembly 26 includes keeper 27 having flat sections 28, small groove 30, and opposite therefrom large groove 32. In FIG. 1 the conductor 22 shown is of a large diameter type conductor which is used with large groove 32. Keeper 27 is reversible in that with a small diameter conductor small groove 30 could be used simply by reversing the keeper assembly and securing it to the top section 20 of sensor 10 with stainless steel bolts 34.

Figure 2:
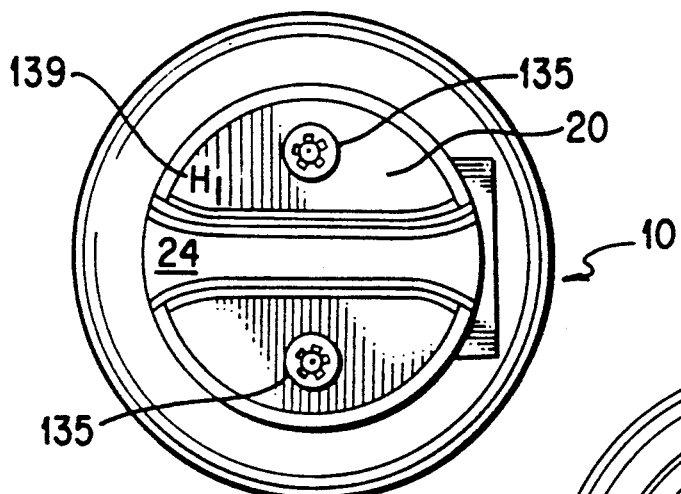
FIG. 2 is a top view of the voltage and current sensor having the primary conductor and keeper assembly removed therefrom.

FIG. 2 illustrates the top portion of the sensor 10 without the keeper 27 installed. Also, FIG. 2 illustrates the sensor 10 without the conductor 22 in groove 24. Embedded brass nuts 135 are shown in top section 20 of sensor 10 which receive stainless steel bolts 34 of the keeper assembly 26 to secure keeper 27 to sensor top section 20. Groove 24 precisely locates the conductor 22 within the top section 20 of sensor 10. Groove 24 in one embodiment has a radius of ⅝ inches, which will allow it to accommodate up to a 1.25 inch diameter primary conductor.

Figure 3:
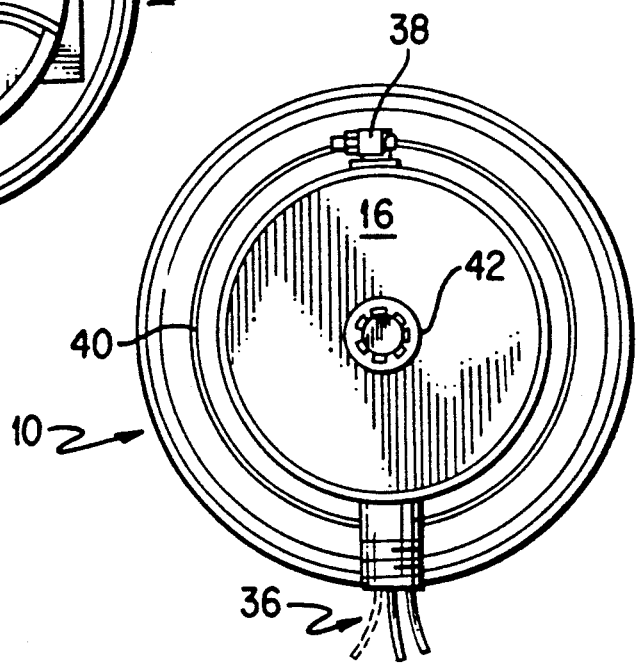
FIG. 3 is a bottom view of the voltage and current sensor without its being mounted to the wooden cross beam.

FIG. 3 illustrates the bottom view of the sensor 10 without the wooden cross beam 12 and mounting bolt 14. On the base 16 of sensor 10, opening 42 in epoxy body 11 allows passage of threaded mounting bolt 14. Also, the relationship of ground terminal 38 and ground wire 40 is shown.

Figure 4:
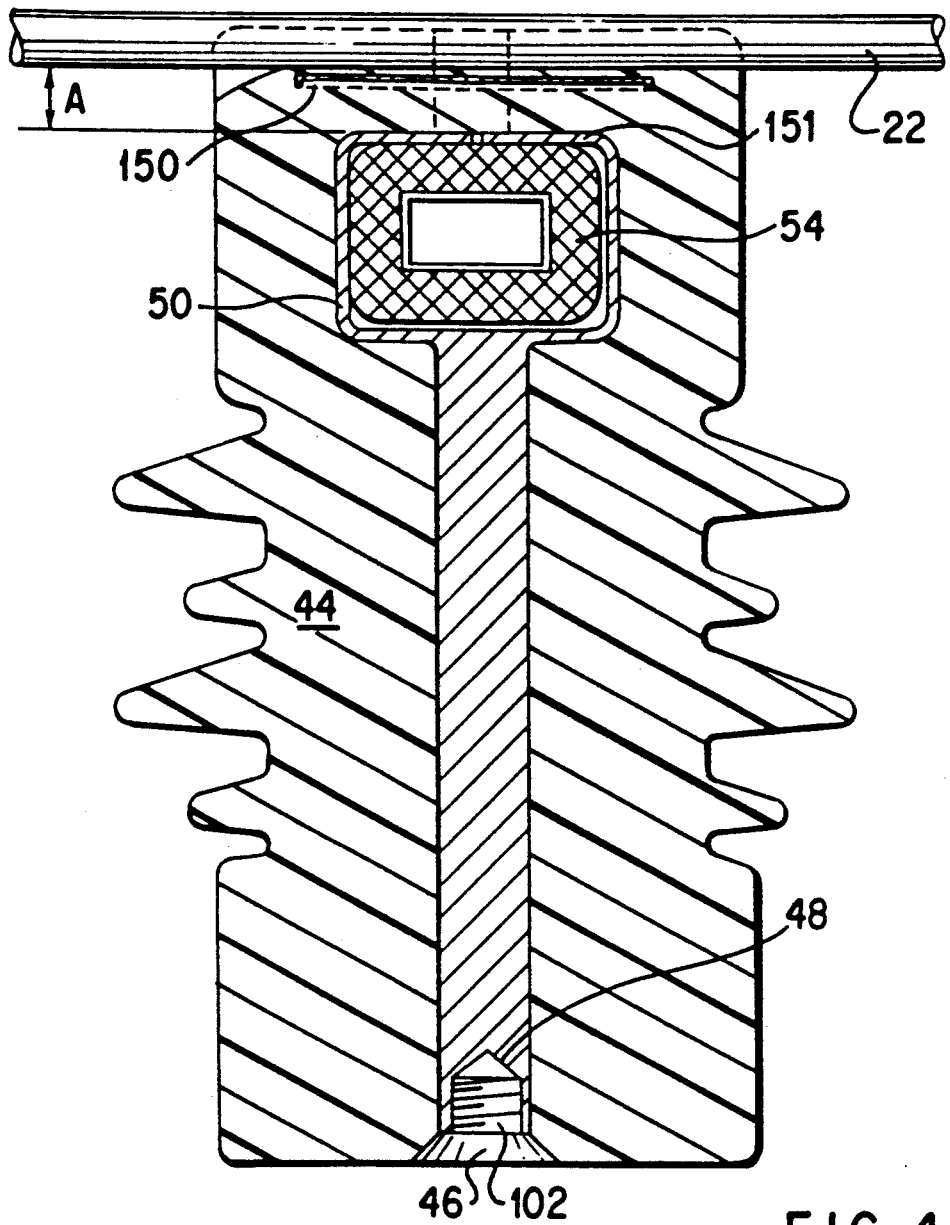
FIG. 4 is a side section view of the voltage and current sensor showing the relationship among the air coil, corona screen and the conductor groove.

FIG. 4 illustrates a section view of sensor 10 and in particular illustrates the relationship of the encapsulated air core coil 54 with respect to groove 24. As can be appreciated, this relationship is critical in obtaining precise, repeatable linear readings by the sensor 10. Aluminum support 48 is mounted within the cast resin epoxy material 44 of the sensor. Aluminum coil encasement 50 is integrally connected with the aluminum support 48 for encasing the encapsulated air coil 54. Aluminum support 48 also serves to precisely locate the position of the air core coil 54 with respect to groove 24 to further ensure the accuracy of the unit. Countersink portion 46 of epoxy body 11 is shown in FIG. 4 in the cast resin epoxy 44 portion of the sensor 10. This countersink serves two functions. First, it assists the easy location of the bolt 14 for threading with opening 42. Second, and more importantly, it allows for the thermal expansion and contraction of the epoxy material 44 and aluminum support 48 with respect to each other in varying temperatures, without imposing excessive forces on epoxy body 11. It should be noted that the co-efficient of expansion for aluminum is different than for the cycloaliphatic epoxy used in the present design. To fail to allow for a means by which the aluminum can expand and contract with respect to the epoxy would cause the epoxy casting to crack. The structural capability of the sensor 10 to mechanically maintain the conductor 22 with respect to the wooden cross beam 12, or other structural member, would be severely hampered if fractures in epoxy body 11 were present. Aluminum support 48 is slidably surrounded by aluminum cross beam 100 and the epoxy body 11, aluminum support 48 and aluminum cross beam 100 are sufficiently free to more among them selves to avoid inducing excessive stress as a result of temperature variations. Thus, the aluminum support 48 and aluminum encasement 50 design, shown in FIG. 4, provide a means by which the air core coil 54 can be precisely placed with respect to groove 24 in a continuous manufacturing process as well as providing a means by which the outdoor application of the sensor 10 can allow for the coefficient of expansion of different types of materials.

Figure 5:
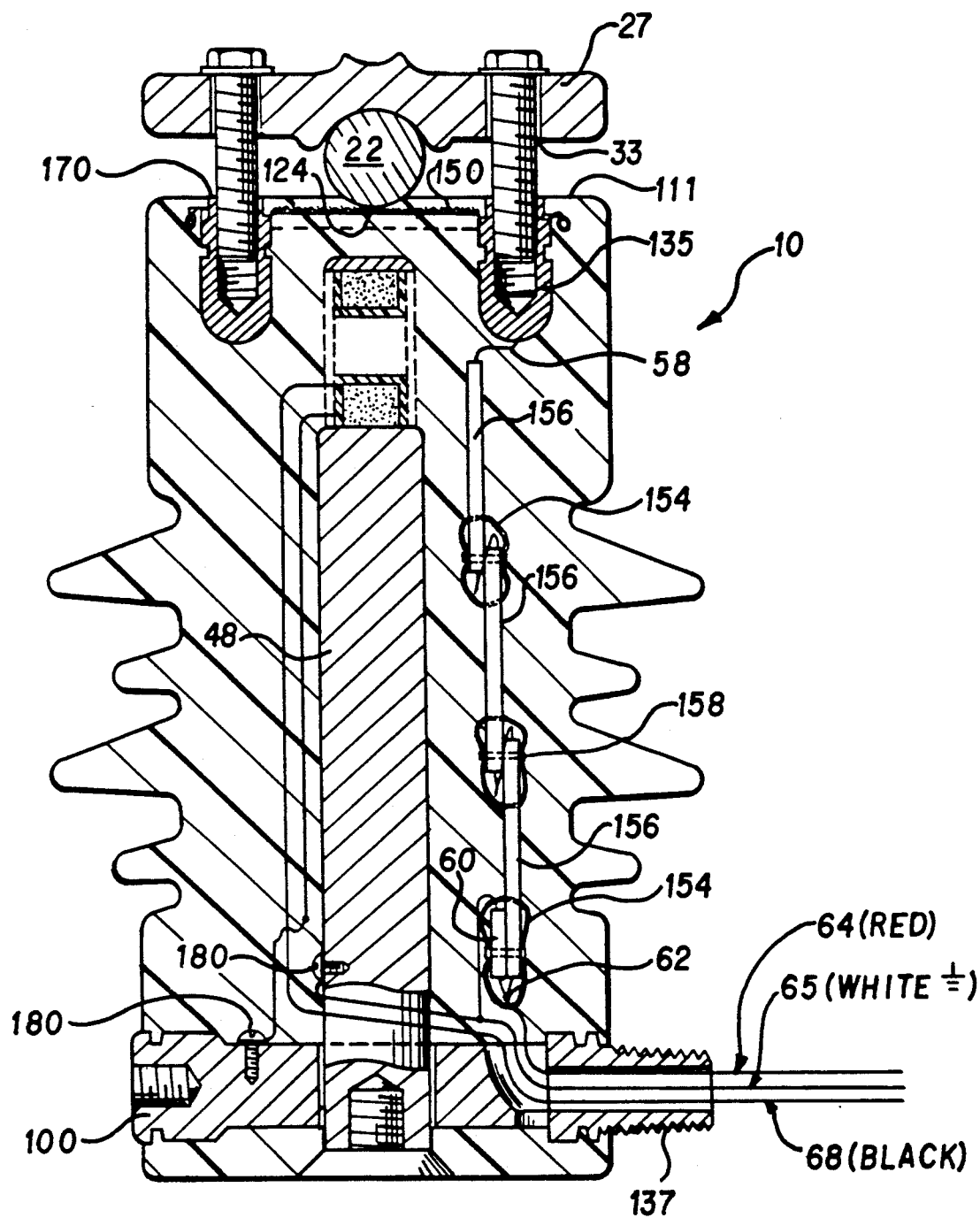
FIG. 5 is a side section view of the voltage and current sensor orthogonal to that of FIG. 4 showing the relationship of the sensor components with respect to the primary conductor.

FIG. 5 illustrates the sensor 10 with the various internal components comprising the voltage and current sensor assembly shown therein. It will be noticed that the keeper assembly 26 is shown connected to the top portion 20 of sensor 10 by means of bolts 34 which pass through unthreaded openings 33 in the flat portion 28 of keeper assembly 26. Bolts 34 are threaded into brass nuts 135 embedded in epoxy body 11. As shown in FIGS. 1 and 5, primary conductor 22 is of a larger diameter which requires the use of groove 32 on keeper assembly 26 rather than smaller groove 30. The keeper 27 is reversible and due to the curvature grooves 30 and 32 precisely locates the conductor 22 within groove 24. Proper location of conductor 22 within groove 24 is essential for the accurate functioning of the sensor 10.

In a sensor of an air core design of the present invention, the distance between the conductor 22 and the air coil 54 is critical. In order to obtain precise and repeatable readings regarding voltage and current in the primary conductor 22, this distance, shown as "A" in FIG. 4, must be precisely located. In one embodiment, it was found that a distance A of 0.904 inch is appropriate for use of the sensor in voltage classes up to and including 38 KV.

FIG. 5 illustrates the voltage sensing apparatus of the sensor 10 connecting wire 58 taken from nut 135 and going to the high voltage primary resistor 156 which, in one embodiment, would be a 200 megaohm resistor. This would be for a 15 KV application. Primary resistor 156 is connected to secondary resistor 60 at split connection 62. Voltage signal lead 64 is connected to split connection 62 and conducts the voltage signal proportionate to the voltage of the primary conductor 22 to the exterior of sensor 10. Ground lead 65 is connected to the opposite end of the low voltage secondary resistor 60 which comprises a 20K ohm resistor in an embodiment for a 15 KV application. In a 25 KV application, the primary resistors 156 would comprise two 200 megaohm resistors in series and the secondary resistors 60 would comprise two 20K ohm resistors in series. In a 38 KV application, the primary resistor would comprise three 400 megaohm resistors in series and one 120K ohm resistor.

The current sensing portion of the sensor apparatus 10 comprises the air core coil 54 having current output lead 68 running therefrom to the output through the output wire tube 137 of cross beam 100. The ground lead 66 runs from open air coil 54 to connect with the low voltage secondary resistor 60 which again, in a 15 KV application, would be a 20K ohm resistor. This white ground lead 66 then also projects outwardly of the output tube 137. Ground lead 66 is connected to support 48 and cross bar 100. This grounds the aluminum support 48 and encasement 50 as well as cross bar 100 for signal purposes. The current output lead 68 would, in one application, go to a programmable controller (not shown) programmed to sense phase angle and the differential of the power factor.

It should be noted that the positioning of the coil in encasement 50 is such that the axis of the coil is normal to the axis of the conductor 22.

The aluminum encasement 50 is an aluminum housing intended to provide a dielectric shield in case of lightning strike or insulation failure due to some other high voltage or transient phenomenon. The encasement 50 will help keep high voltage out of the secondary circuit by directing the high voltage directly to ground through ground wire 40 shown in FIG. 3. Ground cap 38 screws into cross bar 100 at its end opposite output tube 137. Epoxy body 11 encapsulating internal components of sensor 10 is manufactured to be homogenous and free of voids and crystallization. It should be noted that there are a minimum of sharp edges on the internal or embedded components for the purpose of reducing the onset of corona and other such electrical phenomenon.

By indicating the polarity as an additional feature of the device, the air core coil can detect the direction of current flow in the primary conductor. This can be useful in indicating a reverse power flow situation. Polarity indicator H1 shown in FIG. 2 at numeral 139 is intended to point to the power source of conductor 22. For an additive relationship between conductor 22 and the sensor output leads, the polarity indicator is to the same side of sensor 10 as output tube 137. If the relationship is subtractive, the polarity indicator is to the side opposite output tube 137.

When using the sensor in different power applications such as with a 38 KV class application, it is anticipated that the length of the sensor from the base 16 to the top 20 would be 17.97 inches. However, when used with a 25 KV application, the length from the bottom of the base 16 to the top 20 of the sensor 10 would be 14 inches. When used with a 15 KV voltage class, the length from the base 16 of the sensor to the top portion 20 of the sensor is anticipated at 10 inches. This dimension, as well as the dimensions cited for the 38 KV class and 25 KV class are consistent with current insulator sizes which the voltage and current sensor 10 are intended to replace as a structural member. Of course, it must be realized that in differing voltage classifications, the length of the aluminum support 48 will vary to maintain the proper location and placement of the encasement 50 which maintains the air coil 54 from groove 24 located in the top 20 of sensor 10. For use in a 15 KV application, the overall length of the support 48 and the encasement 50 could be 8.84 inches, whereas in the 25 KV application the overall length would be 12.81 inches, and in the 38 KV application the length would be 16.78 inches. This maintains an ease of manufacture since the sensing coils 54 remain the same for all voltage classes. Thus, with a minimum change in parts, the sensor is able to accommodate varying voltage classes in utility applications.

With respect to the keeper assembly 26, it is intended that it would be manufactured of a casting of 356-T6 aluminum with stainless steel mounting bolts 34 used in conjunction therewith. Thus, the clamp assembly 26 which includes the flat section 28, as well as the grooves 30 and 32 and bolts 34, is non-magnetic so as to not interfere with the coil output accuracy. In one application, the mounting bolts 34 would comprise a ½-13×2.00 LG stainless steel bolt used in connection with a ½ stainless steel lock washer. The sensor 10 having skirt 18 would have, in a bottom view such as in FIG. 3, a radius measured from the center of opening 42 to the outermost portion of the skirt 18 of 3.62 inches. Opening 42 would accommodate a ¾ inch utility standard bolt with a 0.781–10 tap to allow for a galvanized bolt. Additional inserts can be added on the base 16 of sensor 10 to provide further support to a structural member if required in a particular application; however, it should be noted that by adding the additional inserts, the difficulties with the varying co-efficients of expansion between the aluminum and the cycloaliphatic epoxy would have to be considered and proper adjustments made.

The keeper assembly 26 includes a width of a 2.82 inches and is intended to receive a torque value for the bolts of 32 foot-pounds. From the center points of openings 33 across the length of keeper assembly 26, the distance is 3 inches. Brass nuts 135 embedded in epoxy body 11 have about 1.38 inches of threaded depth to receive bolts 34. From the center point of either groove 30 or 32 to the outermost portion of flat section 28, the distance measures 2.06 inches in one embodiment. Small groove 30 has a 0.34 inch radius whereas large groove 32 has a 0.59 inch radius. The keeper assembly is entirely rounded at all ends to further reduce the effects of corona. The flat sections have a depth of 0.56 inch, and openings 33 have a diameter of 0.56 inch each. Groove 24 has a radius of 0.62 inch. Again, placement of the conductor and maintenance of the conductor in the precise location of groove 24 is essential to accurate and reliable operation of the voltage and current sensor 10.

With respect to the design of the voltage and current sensor 10, it should be noted that the coil output is linear for all primary conductor 22 sizes. It is intended that with a specific coil winding the sizes of conductor 22 could vary between 0.25 inch outside diameter to 1.25 inches outside diameter which would include approximately 200 different cable sizes. As with prior art devices, it was very difficult to generate or even apply individual correction factors for each cable size. However, in view of the linear feature of the present design, i.e. that the coil output is linear, the correction factors for various size conductors 22 would be represented by a straight line on a graph that would go through zero. Thus, it is possible to develop an equation to identify any line within the family for a given coil design. A typical equation is: $ip = es\,((K1 \times O.D.) + K2)$.

With respect to the above equation, ip represents the primary conductor current to be measured, es represents the sensor coil output in volts, the O.D. represents the primary conductor outside diameter. K1 and K2 are design constants which are determined by the physical coil dimensions and total turns of the coil. One coil design, allows for usage of the equation as follows: $ip = es\,((23.8 \times O.D.) + 78.5)$. In the above equations, 23.8 and 78.5 represent the design constants K1 and K2 relate to a particular physical coil size. It should be noted that with the proposed design, increasing and decreasing primary currents will produce a linear output. Also, the linear output is repeatable, meaning that similar readings will be received on repeat testings. Further, this means that individual units will read consistently with each other from a manufacturing standpoint so long as they are made to the precise tolerances prescribed by the manufacturing drawings.

Figure 6:
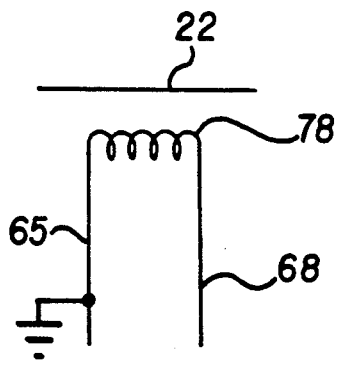
FIG. 6 is a circuit schematic of the current sensing portion of the voltage and current sensor.

FIG. 6 illustrates the current sensor schematic for the electrical circuitry of the current sensing portion of the apparatus. Primary conductor 22 passes in near proximity to the linear coupler 78, which in the present embodiment would comprise the air core coil 54. Current output lead 68 is taken from the linear coupler 78 to the exterior of sensor 10. Ground lead 65 comes from the other end of the linear coupler 78 similarly exits sensor 10 through output tube 137. It is important to keep in mind that one of the main features of the present invention is the fact that the primary conductor 22 is kept a predetermined distance from coupler 78 by virtue of the aluminum support and encasement apparatus encapsulated in the epoxy body 11 of the voltage and current sensor 10.

Figure 7:
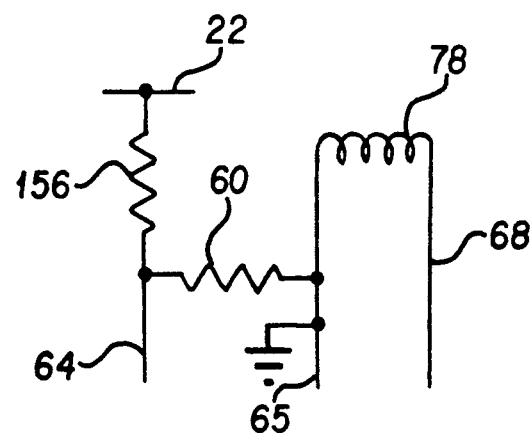
FIG. 7 is a schematic of the voltage and current sensing apparatus for the voltage and current sensor.

FIG. 7 illustrates the voltage and current sensor as combined in the present invention. As can be seen, a low voltage secondary resistor 60 is connected between ground lead 65 and voltage signal lead 64. Voltage signal lead 64 connects to a high voltage primary resistor 156. In turn primary resistor 156 is connected to the primary conductor 22 at its end opposite voltage signal lead 64. In this manner, a voltage and current sensing apparatus is provided as previously described in the present invention.

Figure 8:
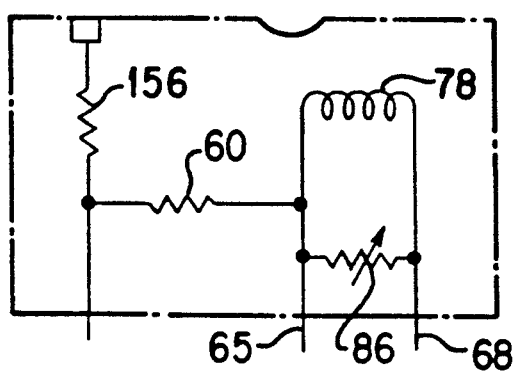
FIG. 8 is a schematic of an alternative embodiment showing the voltage and current sensing diagrams with a variable resistor added.

FIG. 8 illustrates an alternative embodiment of the present invention in which a variable compensating resistor 86 is added between current output lead 68 and ground lead 65. This variable compensating resistor would be provided in instances where extreme accuracy is required. The resistor is then tuned to provide extremely high accuracy readings for the apparatus. It is anticipated, however, that if the coil 54 windings are precisely and carefully wound, in most applications, the variable compensating resistor will not be needed.

An attempt has been made to identify aspects of the present invention which are believed to be incomplete or not disclosed in the parent application with numerals in the hundred series. However, neither an admission of incomplete disclosure nor a representation of complete accuracy is meant by this statement.

Aluminum support 48 includes threaded orifice 102 to secure sensor 10 to mounting bolt 14.

The bulk of the previously undisclosed matter relates to corona screen 150 and components associated with voltage sensing.

Figure 9:
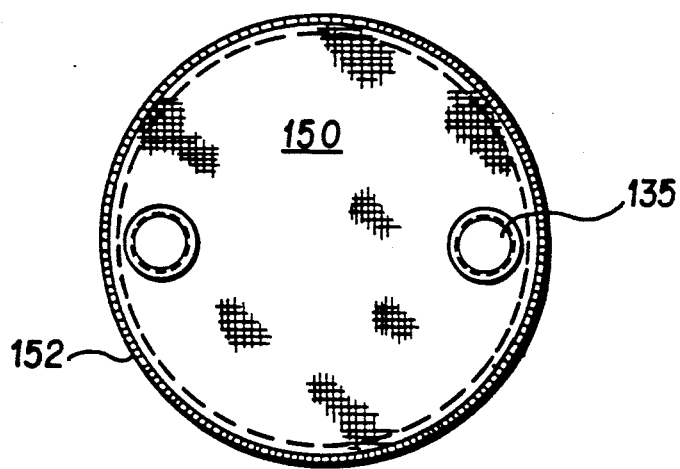
FIG. 9 is a top view of the corona screen and associated brass nuts in isolation.
Figure 10:
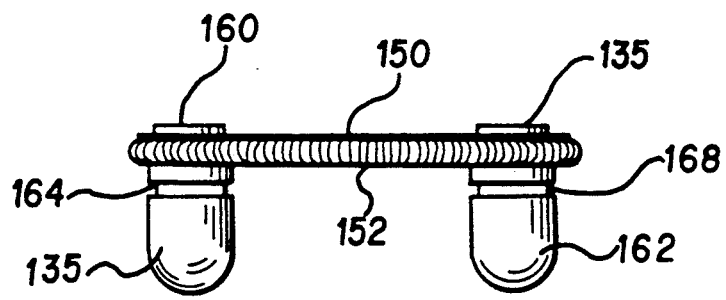
FIG. 10 is a side view of the structure of FIG. 10.

Corona screen 150 with brass nuts 135 are shown in FIGS. 9 and 10. Corona screen 150 is preferably a copper wire mesh cloth, medium square, 30-30 mesh, fabricated from 0.013 diameter mesh wire, in a plain weave, in a 4 inch diameter circular piece. A closed copper wire spring 152 fabricated from number 22 tinned copper bus wire is soldered to the circumference of screen 150. Wire spring 152 has an internal diameter of about 0.125 inches in the helically wound wire. Care should be taken to avoid all burrs or breaks of the wound bus wire and the mesh wire and to ensure that all mesh wire is soldered to spring 152 to avoid concentrating voltage stresses and reduce the effectiveness of the shielding.

Brass nuts 135 are generally cylindrical and have a top end 160 of reduced diameter and a rounded bottom end 162. There is a nut groove 164 intermediate ends 160 and 162. It is desirable to coarsely knurl the circumference of the nuts 135 at their largest diameter. Groove 164 and the knurling grooves tend to give additional adhesion between nuts 135 and epoxy body 11. Nuts 135 are about 1.5 inches long and 0.75 inches in diameter. Top end is about 0.687 inches in diameter and 0.218 inches long. Nut groove 164 is of the same diameter and about 0.342 inches below the lower end 166 of the top end. Rounded end 162 begins about 0.44 inches below the lower end 168 of nut groove 164 and has about a 0.38 inch radius. This rounding of the end also reduces voltage stress concentrations.

Screen 150 is soldered to nuts 135 at the lower end 166 of top end 162 prior to encapsulation in epoxy body 11. When encapsulated as shown in FIG. 5 the uppermost portion 170 of top end 160 is approximately flush with the uppermost portion 111 of epoxy body 11. Screen 150 is interposed between the lowest portion 124 of conductor groove 24 and the top 151 of coil encasement 50. To avoid the possibility of galvanic corrosion when aluminum conductors 22 are used, it is important that the screen 150 be fully encapsulated within epoxy body 11. Some adjustment of the length of top portion 160 may be necessary in some instances. All voltage stresses resulting from the difference in potential between conductor 22 and ground are contained in the epoxy body 11 of high and uniform dielectric strength. It is believed that partial discharges may occur about 70–80 KV well in excess of the requirements for 25 KV and 38 KV units. If a higher margin were desired, either the spacing between components at differing voltages could be increased of a higher dielectric strength body or both could be employed. The corona shield 150 allows placement of air core coil 54 and associated components very close to conductor 22 and thus enhances the precision of current measurement.

FIG. 5 further illustrates additional aspects of the invention relating to voltage sensing and placement of components. Primary resistor 156 may comprise a series string of several physical resistors leading to secondary resistor 60 to form a voltage divider in higher voltage embodiments. The junctions between the physical resistors are soldered and preferably wrapped in an insulating protective wrap 154 such as Kraft paper. The physical resistors may be mechanically secured to each other and the insulating wrap secured to the resistors by, for example, cable ties 158. It is desirable to locate at least the higher potential portions of the voltage sensing portion of sensor 10 at some remove from the current sensing portions to the extent possible. To that end primary 156 and secondary 60 resistors are located directly opposite current output lead 68 and ground lead 65 in their vertical runs within epoxy body 11. Similarly, grounding screws 180 which ground shaft 48 and cross bar 100 are to the side of support 48 opposite the resistors.

The foregoing invention is not limited to the particular details of construction of the device depicted, and other modifications and applications are contemplated. Certain other changes may be made in the above described device without departing from the true spirit and scope of the invention here involved. It is intended, therefore, that the subject matter in the above description shall be interpreted as illustrative and not in a limiting sense.

We claim:

1. A transducer standoff for supporting a power line conductor at a conductor voltage and carrying a conductor current, said transducer standoff measuring a power parameter of the conductor with transducer means, said transducer standoff comprising:
   an elongate conductive support having a support axis extending between a support top and a support bottom, said support having support sides which are regularly spaced from said support axis, said support having a large potential difference from that of the conductor;
   a power transducer affixed to said support top, said transducer including conductive components and having a transducer top, a transducer bottom and transducer sides extending between said transducer top and said transducer bottom, said conductive components having a large potential difference from that of the conductor;
   an elongate body fabricated from insulative epoxy resin, said body having a body top, and a body bottom and a central axis, about which body sides are generally symmetrical, extending between the body top and body bottom, said body sides including skirts extending beyond the mean width of the body and side grooves which do not extend to the mean width of said body, said body completely surrounding said power transducer and slidably surrounding said support from the support top to very near said support bottom, but not covering a substantial portion of said support bottom, so that said support may slide relative to said body without inducing major stresses in said body, said body top located adjacent said transducer top;
   a corona shield interposed between and spaced from said body top and said transducer top, and fully encapsulated within said epoxy body; and
   detachable conductive conductor restraining means for securing the conductor to the body top, said conductor restraining means electrically connected to said corona shield.

2. The transducer standoff of claim 1 wherein:
   said corona shield is circular and generally planar; and said restraining means includes,
   a keeper which is adjustable to accommodate conductors in two ranges of diameter;
   metallic inserts embedded in said epoxy body at said body top, having a threaded orifice and fabricated from a metal having a low galvanic potential from said corona shield electrically connected to said corona shield; and
   bolts inserted through said keeper to affix said keeper to said body top by being received by said metallic inserts, said bolts spaced outwardly of the conductor.

3. A voltage and current transducer standoff for supporting a power line conductor and measuring the potential of the conductor and the current conducted by the conductor, said standoff comprising:
   an elongate conductive support having a support axis extending between a support top and a support bottom, said support having support sides which are regularly spaced from said support axis, said support being at a considerably differing support voltage from the conductor voltage;
   a coil, having a coil axis about which turns of the coil are wound, being exposed to the magnetic flux caused by the current of the conductor, said coil being at a considerably differing coil voltage from the conductor voltage;
   a toroidal coil encasement affixed to the support top surrounding said coil turns with said coil axis aligned to pass through an orifice defined by the toroidal coil encasement, said encasement fixing said coil to said support top and having a coil encasement side which is spaced further from a line established by said support axis than said support sides;
   an elongate body fabricated from insulative epoxy resin, said body having a body top, and a body bottom and a central axis, about which body sides are generally symmetrical, extending between the body top and body bottom, said body sides including skirts extending beyond the mean width of the body and side grooves which do not extend to the mean width of said body, said body completely surrounding said coil encasement and slidably surrounding said support from the support top to very near said support bottom, but not covering a substantial portion of said support bottom, so that said support may slide relative to said body without inducing major stresses in said body, said body further defining a body groove in the body top a select distance above said coil encasement;
   a corona shield fully encapsulated within said body between said body groove and said coil encasement;
   conductive conductor restraining means for securing conductors within said body groove, said restraining means being exposed to the electromagnetic field caused by the potential of said conductor, and electrically connected to said corona shield to cause said corona shield to have a corona voltage at substantially the conductor voltage;

current output leads operatively connected to the coil embedded in said body for their greater portion, said coil leads conducting the signal induced in said coil by said magnetic flux outside said body; and a voltage output lead operatively connected to said conductive conductor restraining means conducting a signal induced in said restraining means by said conductor potential.

4. The transducer of claim 3 wherein:

said conductor restraining means secures a given conductor within a small range of sizes in a small orientation and secures a given conductor within a large range of sizes in a large orientation.

5. The transducer of claim 4 wherein:

said conductor restraining means is not magnetic and further includes a conductive keeper defining a large groove to an upper side and a small groove to a lower side near the median region of said keeper, said keeper further defining at least one bolt orifice at one end of said keeper;

a conductive threaded bolt inserted through said bolt orifice; and a conductive threaded insert received in said body threadably securing said bolt to said insert and thereby removably securing said conductor restraining means to said body, said insert electrically connected to said corona shield.

6. The transducer of claim 3 wherein:

said coil encasement and said support are conductive, but not magnetic, and are electrically connected to each other; and further including a grounding lead operatively connected to said coil encasement and said support, embedded in said body for the greater length of said lead, providing a conductive path to ground potential.

7. The transducer of claim 6 wherein one of said current output leads is connected to said grounding lead.

8. The transducer of claim 7 wherein said voltage output lead includes a dropping resistor.

9. The transducer of claim 8 further including:

a grounding resistor connected at a dropping end to said dropping resistor at the connection of said dropping resistor opposite the connection of said dropping resistor to said voltage output lead going to one of said threaded inserts, and said grounding resistor connected to said grounding lead at a grounding end.

10. The transducer of claim 9 wherein said dropping and grounding resistors are on a side of said support opposite to that of the current output leads.

11. The transducer of claim 10 wherein a joiner between said resistors is surrounded by an insulative wrap; and further comprising mechanical securement means for mechanically securing the joined resistors to each other and for mechanically securing the insulative wrap to said resistors.

12. The transducer of claim 5 wherein:

said insert is generally cylindrical and has a reduced diameter top portion, a rounded bottom portion, and upper and lower full diameter portions separated by an insert groove.

13. The transducer of claim 12 wherein the upper and lower full diameter portions have adhesion means for increasing the adhesion between said insert and said body.

14. The transducer of claim 13 wherein:

said insert is brass;

said bolt is stainless steel;

said corona shield is copper; and said keeper is aluminum.

15. The transducer of claim 14 wherein:

said corona shield includes a circular copper mesh screen, and further includes a copper spring wire soldered to the circumference of the mesh.

16. The transducer of claim 5 wherein:

said corona shield is generally a planar circle having a shield circumference.

17. The transducer of claim 16 wherein:

said corona shield includes a circular copper mesh screen, and further includes a copper spring wire soldered to the circumference of the mesh.

* * * * *